United States Patent
Hélot et al.

(10) Patent No.: US 9,933,820 B2
(45) Date of Patent: Apr. 3, 2018

(54) DISPLAY DEVICE FOR A MOTOR VEHICLE, METHOD FOR OPERATING A DISPLAY DEVICE, AND MOTOR VEHICLE HAVING A DISPLAY DEVICE

(71) Applicant: AUDI AG, Ingolstadt (DE)

(72) Inventors: Jacques Hélot, Ingolstadt (DE); Sandro Weigelt, Lenting (DE); Immo Redeker, Ingolstadt (DE); Ulrich Hackenberg, Wettstetten (DE); Roland Mayer, Lenting (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/311,374

(22) PCT Filed: Oct. 6, 2015

(86) PCT No.: PCT/EP2015/001948
§ 371 (c)(1),
(2) Date: Nov. 15, 2016

(87) PCT Pub. No.: WO2016/070951
PCT Pub. Date: May 12, 2016

(65) Prior Publication Data
US 2017/0083047 A1  Mar. 23, 2017

(30) Foreign Application Priority Data
Nov. 3, 2014 (DE) .......... 10 2014 016 323

(51) Int. Cl.
*G06F 1/16* (2006.01)
*B60K 37/06* (2006.01)
*H01L 27/32* (2006.01)

(52) U.S. Cl.
CPC .............. *G06F 1/166* (2013.01); *B60K 37/06* (2013.01); *G06F 1/1643* (2013.01);
(Continued)

(58) Field of Classification Search
CPC combination set(s) only.
See application file for complete search history.

(56) References Cited

U.S. PATENT DOCUMENTS 5,469,020 A * 11/1995 Herrick ................. G02F 1/1365
257/E25.02
7,198,393 B2 * 4/2007 Tubidis ................... B60K 35/00
313/511

(Continued)

FOREIGN PATENT DOCUMENTS

| | | |
|---|---|---|
| CN | 102855815 | 1/2013 |
| DE | 197 82 261 C2 | 2/2000 |

(Continued)

OTHER PUBLICATIONS

English translation of the International Preliminary Report on Patentability dated May 18, 2017 from International Patent Application No. PCT/EP2015/001948, 7 pages.

(Continued)

*Primary Examiner* — Lisa Lea Edmonds
(74) *Attorney, Agent, or Firm* — Staas & Halsey LLP

(57) ABSTRACT

A flexible display apparatus and an adjusting apparatus which is designed to move the flexible display apparatus from a stowing position into a usage position are included in a display device for a motor vehicle. The adjusting apparatus is designed to bend the flexible display apparatus from the stowing position into the usage position.

18 Claims, 8 Drawing Sheets

(52) U.S. Cl.
CPC .......... *G06F 1/1652* (2013.01); *H01L 27/323* (2013.01); *B60K 2350/352* (2013.01); *B60K 2350/405* (2013.01); *B60K 2350/925* (2013.01)

(56) References Cited

U.S. PATENT DOCUMENTS

| | | | |
|---|---|---|---|
| 9,272,671 B2* | 3/2016 | Vander Sluis | B60R 11/0235 |
| 9,683,875 B2* | 6/2017 | Hackenberg | B60K 35/00 |
| 2005/0254202 A1* | 11/2005 | Chen | B60R 11/0235 361/679.27 |
| 2009/0161302 A1* | 6/2009 | Ferren | B60K 35/00 361/679.01 |
| 2012/0268665 A1* | 10/2012 | Yetukuri | B60K 35/00 348/837 |
| 2013/0002114 A1 | 1/2013 | Hamers et al. | |
| 2014/0099479 A1 | 4/2014 | Krall et al. | |
| 2014/0166992 A1 | 6/2014 | Hack et al. | |
| 2016/0259365 A1* | 9/2016 | Wang | B60K 35/00 |

FOREIGN PATENT DOCUMENTS

| | | |
|---|---|---|
| DE | 101 15 050 A1 | 10/2002 |
| DE | 10 2007 033 534 A1 | 1/2009 |
| DE | 10 2008 015 275 A1 | 10/2009 |
| DE | 10 2014 016 323.7 | 11/2014 |
| EP | 1 245 429 A2 | 10/2002 |
| EP | 1 635 313 A2 | 3/2006 |
| EP | 2 421 231 A1 | 2/2012 |
| KR | 10-2013-0117110 | 10/2013 |
| WO | 2011/062583 A1 | 5/2011 |
| WO | PCT/EP2015/001948 | 10/2015 |

OTHER PUBLICATIONS

German Office Action dated Jun. 25, 2015 from German Patent Application No. 10 2014 016 323.7, 6 pages.
International Search Report dated Feb. 10, 2016 from International Patent Application No. PCT/EP2015/001948, 4 pages.
Chinese Office Action dated Dec. 5, 2017 from Chinese Patent Application No. 201580014685.8, 9 pages.

* cited by examiner

DISPLAY DEVICE FOR A MOTOR VEHICLE, METHOD FOR OPERATING A DISPLAY DEVICE, AND MOTOR VEHICLE HAVING A DISPLAY DEVICE

CROSS REFERENCE TO RELATED APPLICATIONS

This application is a U.S. national stage of International Application No. PCT/EP2015/001948, filed on Oct. 6, 2015. The International Application claims the priority benefit of German Application No. 10 2014 016 323.7 filed on Nov. 3, 2014. Both the International Application and German Application are incorporated by reference herein in their entirety.

BACKGROUND

Described herein is a display device for a motor vehicle and a method for operating a display device. Also described herein is a motor vehicle having the display device.

It is becoming ever more common in motor vehicles for displays, in particular touchscreen displays, to be arranged for example in the instrument panel or in the central console. In particular, in order to make touchscreens operable in optimum fashion, operating panels of a graphical user interface must be adapted to the finger size. This often leads to relatively large displays, in particular if graphical user interlaces with numerous operating elements must be displayed. This in turn leads to correspondingly large receiving regions within motor vehicles, for example in the region of central consoles and dashboards.

Furthermore, during operation of such touchscreens, there is also, in part, the problem that, in particular, a driver must perform a multiplicity of inputs in order to find his or her desired operating surface within a menu structure of the touchscreen. This harbors the risk of his or her attention being diverted from the traffic situation.

When such displays are not presently being used, it is generally known for the displays to be designed to be retractable and deployable. This is however relatively expensive and requires a relatively robust construction, in particular if touch operation, with frequent touch action, of such displays is provided. Furthermore, for optimum ergonomic operation of a touchscreen, it is necessary to provide a support surface for the hand or the arm. Normally, however, the distance between a corresponding support surface and a display assigned to the support surface is not constant. As a result, vehicle occupants must, during operation, move not only their fingers but usually also their entire hand.

German Patent Application Publication No. 10115050 A1 describes a display device for a motor vehicle, which display device has a flexible display apparatus and an adjusting apparatus, wherein the adjusting apparatus is designed to move the display apparatus from a stowing position into a usage position. Here, the adjusting apparatus includes a drive gearwheel by way of which the flexible display apparatus can be deployed in the manner of a roller blind from a non-visible stowing position, in which it is arranged in a receiving region, into the usage position, in which it is visible to a vehicle occupant.

WIPO Patent Application Publication No. 2011/062583 A1 describes a roller-blind-like flexible display which can likewise be moved from a stowing position into a usage position.

Korean Patent Application Publication No. 20130117110 A describes a curved display, wherein the curvature of the display can be adapted in a manner dependent on the situation. In a manner dependent on respective positions of viewers viewing the display, the curvature of the display is adapted such that all persons can view the display at a particularly expedient viewing angle.

SUMMARY

Described herein is an improved solution by way of which a display apparatus can be moved from a stowing position into a usage position.

The display device for a motor vehicle described herein includes a flexible display apparatus and an adjusting apparatus which is designed to move the display apparatus from a stowing position into a usage position. The display device is in this case characterized in that the adjusting apparatus is designed to bend the display apparatus from the stowing position into the usage position. Furthermore, the display apparatus can in turn also be bent from the usage position back into the stowing position by way of the adjusting apparatus.

The adjusting apparatus preferably has a pivotable lever mechanism which is designed to bend the display apparatus from the stowing position into the usage position. By way of the pivotable lever mechanism, the display apparatus can be bent from the stowing position into the usage position particularly easily. Furthermore, with the pivotable lever mechanism, the display apparatus can in turn also be bent from the usage position back into the stowing position.

The display device preferably includes a depression which is formed in one component and in which the display apparatus is arranged flat when in the stowing position. For example, the display apparatus may terminate flush with the respective component when the display apparatus is arranged in the stowing position. In the usage position, at least a part of the display apparatus is bent out of the depression. In other words, in the usage position, the display apparatus is bent away from the respective component.

By way of the display device described herein, it is thus the case that the flexible display apparatus is no longer mechanically retracted and deployed. Instead, the flexible display apparatus can be bent upward into the usage position in a simple manner by way of the adjusting apparatus, in particular by way of the pivotable lever mechanism, if the flexible display apparatus is to be operated by a vehicle occupant.

A viewing side of the display apparatus, or at least a part of the viewing side, on which various content can be displayed to a vehicle occupant, is in this case concavely curved in the usage position. In other words, in the usage position, a rear side, facing away from a vehicle occupant, of the display apparatus is convex, and a front side, facing toward a vehicle occupant, of the display apparatus is concave. A spacing between a support surface for a hand of a vehicle occupant and the display apparatus may furthermore, by way of the display device described herein, be made substantially constant, by contrast to a display that can be retracted and deployed mechanically. In particular, by way of the concave curvature of the front side or of the viewing side of the display apparatus in the usage position, the spacing between a support surface for a hand of a vehicle occupant and the display apparatus can be made substantially constant. In this way, it is in particular also the case that the ergonomics during the operation of the flexible display apparatus are improved. The spacing between the flexible display apparatus and a hand of a vehicle occupant or between fingers of the vehicle occupant and the display apparatus may also be adjustable such that vehicle occupants with hands of different size can operate the flexible display apparatus in a particularly ergonomic manner. For example, the angle of inclination through which the flexible display apparatus is bent into the usage position by way of the adjusting apparatus may be manually settable or may be configured so as to be automatically regulable by way of sensors.

In an advantageous embodiment, it is provided that the lever mechanism has at least one lever which, by way of one end region, is pivotably mounted on a component of the display device other than the display apparatus and which, by way of an opposite end region, is mounted on a linear guide which is fastened to the display apparatus. In this way, the flexible display apparatus can be bent back and forth between the stowing position and the usage position in a particularly simple and reliable manner. By way of the linear guide, particularly precise guidance of the lever along the display apparatus is made possible. In this way, the display apparatus can be bent from the stowing position into the usage position, and also back into the stowing position again, in a particularly exact and reliable manner.

In an alternative advantageous embodiment of the display device, it is provided that the lever mechanism has two levers which, by way of respective end regions, are pivotably mounted on at least one component of the display device other than the display apparatus and which, by way of respective opposite end regions, are mounted on respective linear guides which are fastened to the display apparatus. In an intended arrangement of the display device in a motor vehicle, it is thus made possible for the flexible display apparatus to be bent upward not only in a vehicle vertical direction. Owing to the two levers, it is furthermore possible for the flexible display apparatus to be inclined in the direction of a driver or of a front-seat passenger—that is to say in a vehicle transverse direction—such that the respective vehicle occupants can view and operate the flexible display apparatus in a particularly ergonomic manner. For example, the display device may have a corresponding sensor arrangement which is designed to detect whether a driver or a front-seat passenger presently wishes to operate the flexible display apparatus, wherein, in a manner dependent thereon, the adjusting apparatus is actuated such that the two levers are actuated or moved such that the flexible display apparatus is inclined for example in the direction of a driver or of a front-seat passenger. It is thus possible for different usage positions to be set, wherein these may be a driver-oriented usage position and a front-seat passenger-oriented usage position.

In a further advantageous embodiment, it is provided that the display apparatus has multiple layers arranged one on top of the other, wherein only the upper layer is fastened, in a first end region of the display apparatus, to a component other than the display apparatus, and the layers of the display apparatus are connected to one another by way of a clamping apparatus at a free end region, arranged opposite the first end region, of the display apparatus. One or more of the layers arranged under the upper layer can thus move in a translational fashion relative to the upper layer during the bending-up of the display apparatus from the stowing position into the usage position. During the bending-up of the flexible display apparatus, the layers arranged one beneath the other are, specifically, bent with different intensity, wherein, owing to the relative mobility of the layers with respect to one another, these can be displaced relative to one another during the bending-up of the display apparatus into the usage position. Owing to this degree of freedom, it is possible for undesired and possibly damaging stresses within the individual layers to be avoided, which would otherwise possibly result in undulating unevennesses in the layers. The translational relative movements may give rise to electrostatic charging of the individual layers. As a result, it may be the case that the layers locally attract one another, which may lead to undesired formation of bulges. This has an adverse effect inter alia on the visual appearance. It is therefore provided that an antistatic coating can be applied to those layers which can move in translational fashion relative to one another.

In a further advantageous embodiment, it is provided that the upper layer is a transparent cover layer under which there is arranged a display layer which has organic light-emitting diodes. The transparent cover layer protects the display layer situated beneath it from environmental influences. The display layer is thus preferably an OLED layer. Such OLED layers can, in the active state, be bent in the manner of a plastics foil. In general, the display apparatus may thus be an OLED display. The transparent cover layer is in this case likewise of flexible form, and may be produced for example from a plexiglass or a flexible glass. For example, the cover layer may be produced from a thin, chemically prestressed glass from the group of aluminosilicate glasses. Such a glass is known under the brand name Gorilla Glass. The cover layer may also be of partially transparent form and have a tint. By way of the tint, an adhesion-promoting layer, also referred to as primer layer, which is applied under the cover layer, can be visually concealed. The cover layer preferably has an anti-reflection surface or a corresponding anti-reflection coating. This is conducive to the display apparatus being particularly easy to read even in the bent state.

In a further advantageous embodiment, it is provided that the upper layer is a transparent cover layer under which there are arranged a transparent touch-sensitive sensor layer and a display layer which has organic light-emitting diodes. The display apparatus may generally be a touchscreen, regardless of whether the display layer has organic light-emitting diodes or some other construction. In other words, the display apparatus is preferably a touchscreen, wherein, by way of the touch-sensitive sensor layer, which is likewise of flexible form, touch actions on the display apparatus can be detected and converted into corresponding control signals. In this embodiment, too, the transparent cover layer serves as a protective layer by way of which the touch-sensitive sensor layer and the display layer, which has organic light-emitting diodes, are protected against environmental influences during operation.

A further advantageous embodiment provides that, under the display layer, there is arranged a support layer which exerts on the display layer a force directed in the direction of the cover layer and which, with respect to the first end, is at least relatively movable in relation to the cover layer. The support layer may for example be formed as a type of spring element, for example in the form of a leaf spring or the like. By way of the support layer, the other layers are thus pressed against the cover layer, such that the individual layers remain entirely in contact with one another. In other words, the cohesion of the individual layers of the display apparatus is ensured by way of the support layer.

In a further advantageous embodiment, it is provided that the display device has a cover which, in the usage position of the display apparatus, conceals an opening which arises as a result of the pivoting of the display apparatus from the stowing position into the usage position. Firstly, the ingress of dirt into the opening can thereby be prevented and, secondly, the visual appearance of the display device as a whole is improved by way of the cover. In particular, by way of the cover, it is possible to prevent relatively small articles, such as for example keys, pieces of paper or food residues and the like, from passing into the opening.

The motor vehicle described herein includes the display device described herein, or an advantageous embodiment of the display device described herein.

In an advantageous embodiment of the motor vehicle, it is provided that the display apparatus is arranged on a central tunnel of the motor vehicle, in front of a gear selector lever of the motor vehicle as viewed in a forward direction of travel. The gear selector lever may for example be a so-called shift-by-wire lever by way of which different drive stages of the motor vehicle can be selected. By virtue of the fact that the display apparatus is arranged in front of the gear selector lever, a vehicle occupant can use the gear selector lever as a hand rest, whereby he or she can operate the display apparatus particularly comfortably, in particular if the display apparatus is a touchscreen. The positioning of the display apparatus is in this case not restricted to the central tunnel of the motor vehicle. Instead, the display apparatus may be arranged at substantially any desired positions in the motor vehicle, for example in an instrument panel or else in a rear-seat region of the motor vehicle. In the rear-seat region, the display apparatus may for example be arranged in a central console arranged in the second seat row.

In the method described herein for operating a display device of a motor vehicle, a flexible display apparatus of the display device is moved from a stowing position into a usage position by way of an adjusting apparatus of the display device. The method described herein is in this case characterized in that the display apparatus is bent from the stowing position into the usage position by way of the adjusting apparatus. Advantageous embodiments of the display device described herein are in this case to be regarded as advantageous embodiments of the method described herein, wherein the display device is used to carry out the method.

In an advantageous embodiment of the method described herein, it is provided that the display apparatus is bent from a stowing position into the usage position as soon as an ignition of the motor vehicle has been activated. In other words, the display apparatus is automatically bent from the stowing position into the usage position as soon as the "terminal 15 on" state is present. It may also be the case that the display device is first activated for the purposes of displaying content when the ignition of the motor vehicle has been activated. The display apparatus is thus automatically bent up from the stowing position into the usage position, with the display activated, as soon as an ignition of the motor vehicle has been activated.

In a further advantageous embodiment of the method described herein, it is provided that the display apparatus is bent from the usage position into the stowing position as soon as an ignition of the motor vehicle has been deactivated. In other words, the display apparatus is thus bent back into the stowing position again without a vehicle occupant having to actively handle the display device. Furthermore, it may however also be provided that the display device has an operating element, by way of the actuation of which a bending-up movement of the display apparatus from the stowing position into the usage position, and a bending-down movement from the usage position into the stowing position, can be initiated. Alternatively or in addition, it may also be provided that, by way of a double tap on the display apparatus when it is arranged in its stowing position, a movement of the display apparatus into the usage position can be initiated. Then, in the usage position, it is possible to initiate a movement of the display apparatus back into its stowing position for example by way of a relatively long touch of the display apparatus, for example using five fingers simultaneously. In this way, vehicle occupants can also actively initiate a bending-up movement and a bending-down movement of the display apparatus and preferably also, in conjunction therewith, an activation and deactivation of a display of the display apparatus.

Finally, in a further advantageous embodiment of the method described herein, it is provided that the usage position is predefined in a manner dependent on a detected personal identifier. In other words, the inclination of the display apparatus by way of which the usage position is defined is predefined in a user-specific manner. For example, it may be detected which vehicle key has been used to unlock the motor vehicle, wherein a respective usage position, that is to say a respective user-specific inclination of the display apparatus in the usage position, is predefined on the basis of a key identifier. Alternatively or in addition, it may also be provided that a mobile terminal, in particular a smart phone, is automatically coupled to the motor vehicle upon entering the motor vehicle. The personal identifier is realized on the basis of the coupled mobile terminal. In this way, it is for example the case that a driver is always provided with a usage position of the display apparatus which is particularly comfortable for him or her and which is set to the anatomy of his or her hand with which he or she wishes to operate the display apparatus. For example, the display device can be operated in a setting mode in which a vehicle occupant can manually—for example by way of a switch or else by way of a displayed menu of the display apparatus—vary the inclination of the display apparatus and then store this in a usage position he or she desires. Furthermore, it may also be provided that, in addition to the personalized inclination of the display apparatus, yet further personalized settings, such as for example a double-tap speed or else a zoom speed and the like, can be implemented using the personal identifier. It is substantially possible for all conceivable personalizable settings on the display apparatus to be coupled to the personal identifier.

BRIEF DESCRIPTION OF THE DRAWINGS

Further advantages, features and details will emerge from the following description of exemplary embodiments and from the drawings. The features and feature combinations mentioned above in the description, and the features and feature combinations mentioned below in the description of the drawings and/or shown in the drawings alone may be used not only in the respective specified combination but also in other combinations or individually without departing from the scope of the invention. These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Figure 1:
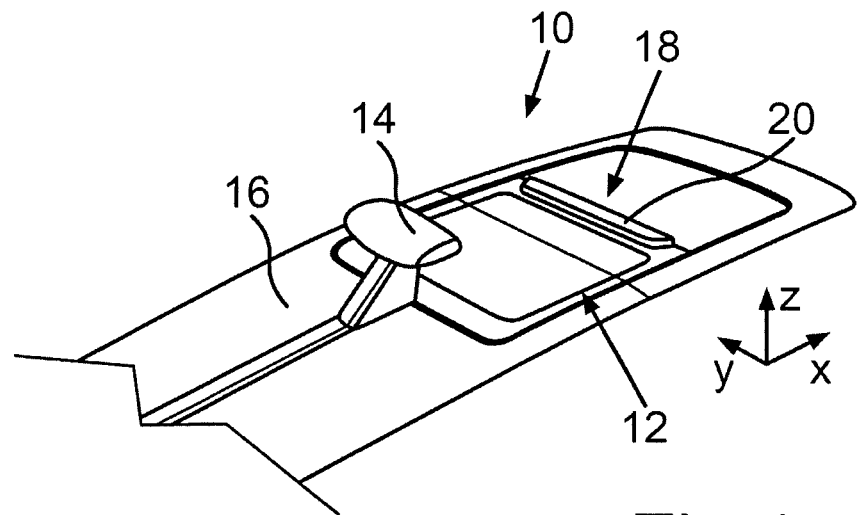
FIG. 1 is a perspective view of a partially illustrated central tunnel of a motor vehicle, wherein, in front of a gear selector lever of the motor vehicle, a flexible display apparatus is illustrated in its stowing position in which it is recessed flat into the central tunnel.

Reference will now be made in detail to embodiments, examples of which are illustrated in the accompanying drawings, wherein identical or functionally identical elements are denoted by the same reference numerals in the drawings.

A display device, denoted overall by 10, for a motor vehicle is shown in a schematic perspective view in FIG. 1. The display device 10 includes a flexible display apparatus 12 which is arranged, in front of a gear selector lever 14 as viewed in a vehicle longitudinal direction x, on a central tunnel 16 of a motor vehicle (not shown in any more detail). The display device 10 includes a depression (not designated in any more detail here) which is formed in the central tunnel 16 and in which the display apparatus 12 is arranged flat in the stowing position shown here. The top side of the display apparatus 12 is, in the stowing position, arranged so as to terminate substantially flush with the central tunnel 16. To a free end region 18 of the display apparatus 12 there is attached a clamping apparatus 20, wherein the clamping apparatus 20 serves for connecting together, or holding together, multiple layers (not shown here) of the display apparatus 12. The clamping apparatus 20, and the construction thereof, will be discussed in more detail in conjunction with the following figures.

Figure 2:
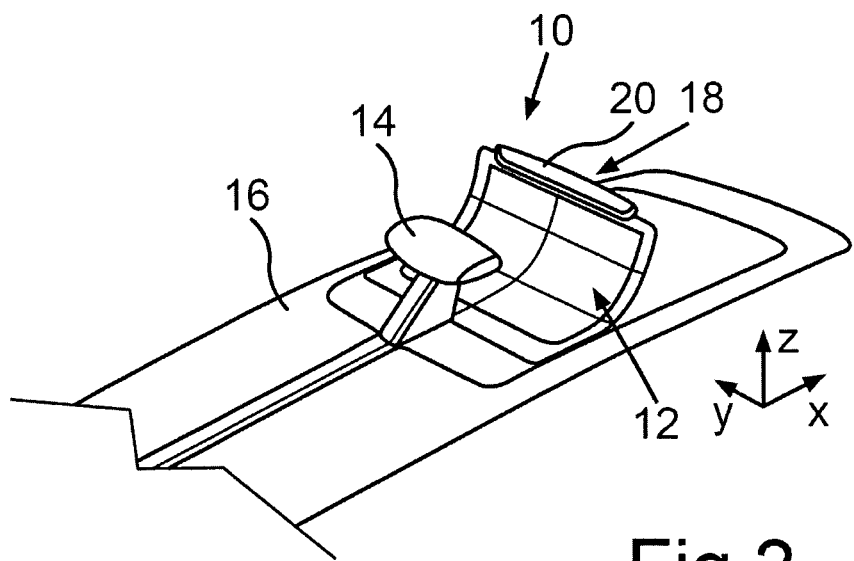
FIG. 2 is a further perspective view of the central tunnel of the motor vehicle, wherein the flexible display apparatus is shown in an upwardly bent usage position.

Referring to FIG. 2, the display device 10 is shown in a further perspective view. In the situation shown here, the display apparatus 12 is shown in a usage position, in which it has been bent upward in a vehicle vertical direction z. For this purpose, the display device 10 includes an adjusting apparatus (not illustrated) which is designed to bend the display apparatus 12 upward from the stowing position shown in FIG. 1 into the usage position shown in FIG. 2. The display apparatus 12 may be bent from the stowing position shown in FIG. 1 into the usage position shown in FIG. 2 as soon as an ignition of the motor vehicle has been activated, that is to say a "terminal 15 on" state is present. At the same time as the bending-up of the display apparatus 12 into the usage position, the display apparatus 12 is activated for the purposes of displaying various contents, for example a graphical user interface. As soon as the ignition of the motor vehicle is deactivated again, that is to say a "terminal 15 off" state is present, the display apparatus 12 is in turn automatically bent back from the usage position shown in FIG. 2 into the stowing position shown in FIG. 1.

It may furthermore be provided that the display device 10 includes an operating element (not illustrated here), for example in the form of a pushbutton, by way of which a driver can initiate a bending-up movement of the display apparatus 12 into the usage position and, in turn, a bending-down movement of the display apparatus 12 into the stowing position. Furthermore, it may also be provided that a vehicle occupant can initiate the adjustment of the display apparatus 12 from the stowing position into the usage position and back again by way of correspondingly predefined multi-touch gesture operation of the display apparatus 12.

Figure 3:
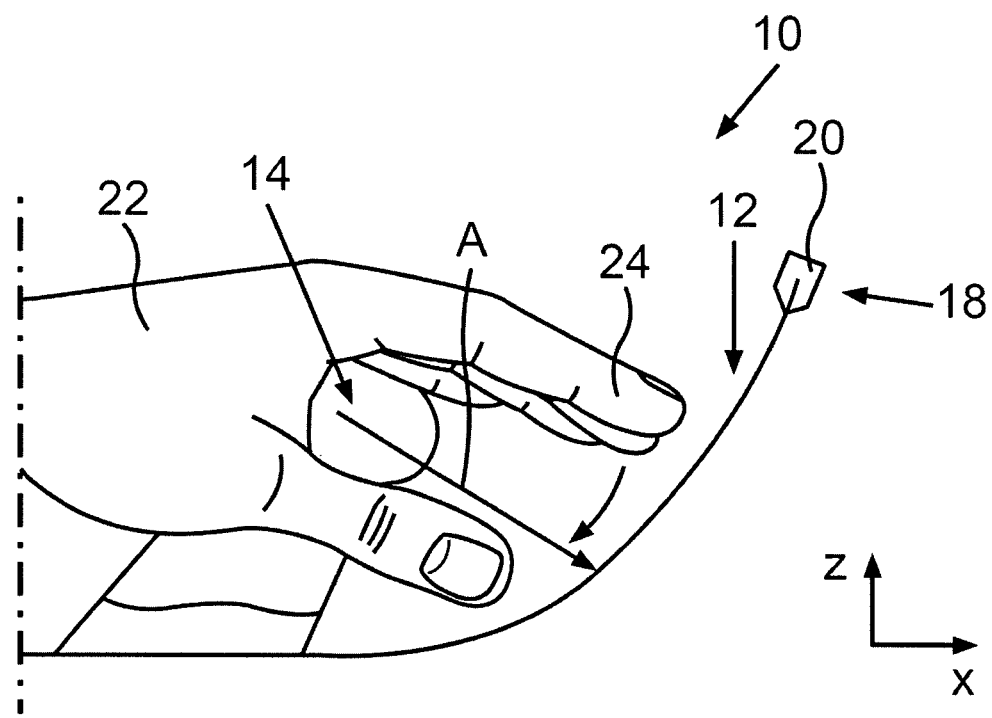
FIG. 3 is a side view in which the gear selector lever and the display apparatus, which has been bent upward into its usage position, are shown.

Referring to FIG. 3, a schematic side view is shown where the display apparatus 12 is bent up into the stowing position. As can be seen, the gear selector lever 14, which may for example be a so-called shift-by-wire lever, serves as a support for a hand 22 of a vehicle occupant, such that he or she can for example use his or her index finger 24 to comfortably operate the display apparatus 12 that has been bent up into the usage position. By virtue of the fact that the display apparatus 12, in the usage position, is curved upward in arcuate fashion in the vehicle vertical direction z and in the direction of the hand 22 or in the direction of the gear selector lever 14, that is to say in the vehicle longitudinal direction x, a substantially constant spacing A between the gear selector lever 14 and the display apparatus 12 is realized. Consequently, it is for example also the case that the index finger 24 is at a substantially equal distance from all points of the upwardly curved display apparatus 12, such that a vehicle occupant can use his or her index finger 24 to touch the display apparatus 12 without having to move his or her hand 22 further. In the present case, this is particularly advantageous because the display apparatus 12 is a so-called touchscreen. In other words, a vehicle occupant can control a wide variety of functions of the motor vehicle by touching the display apparatus 12.

Figure 4:
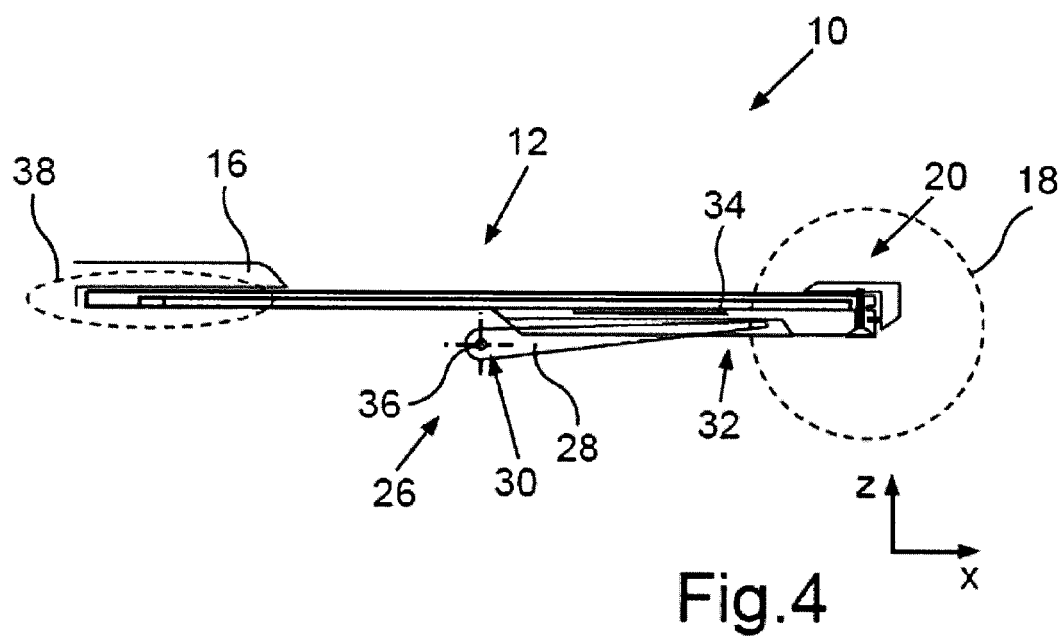
FIG. 4 is a sectional side view illustrating a multi-layer construction of the flexible display apparatus and a lever of an adjusting apparatus in the lowered stowing position.

Referring to FIG. 4, the display device 10 is shown in a schematic side view, wherein an adjusting apparatus (not designated in any more detail) has a pivotable lever mechanism 26. The display apparatus 12 is, in the present case, again shown in its lowered stowing position. In the embodiment shown in FIG. 4, the pivotable lever mechanism 26 includes a single lever 28 which, by way of one end region 30, is pivotably mounted on a component (not illustrated here) of the display device 10 other than the display apparatus 12, and, by way of an opposite end region 32, is mounted on a linear guide 34 which is fastened to the display apparatus 12.

The lever 28 can thus be pivoted about an axis of rotation 36 running in the vehicle transverse direction y in order to move the display apparatus 12 from the stowing position shown here into the upwardly bent usage position. For example, for this purpose, the adjusting apparatus includes an electric motor (not illustrated here) by way of which the lever 28 can be pivoted about the axis of rotation 36.

During the bending-up of the display apparatus 12 into the usage position, the end region 32 is guided in the linear guide 34, wherein the end region 32 can move relative to the display apparatus 12 but, in so doing, always remains in contact with the display apparatus 12, more specifically with the linear guide 34.

Also in FIG. 4, the end region 18 in which the clamping apparatus 20 is arranged is shown. Also indicated is a further end region 38, arranged at the left in FIG. 4, of the display apparatus 12, which end region is arranged below a projection (not designated in any more detail) of the central tunnel 16.

Figure 5:
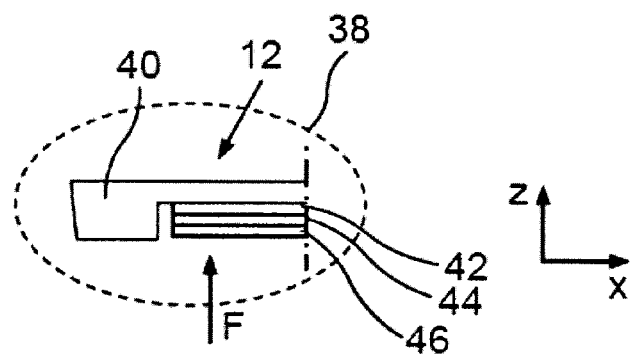
FIG. 5 is a sectional side view of a detail of the flexible display apparatus, wherein the different layers of the flexible display apparatus are illustrated, with the display apparatus arranged in its stowing position.

Referring to FIG. 5, in an enlarged illustration, the end region 38 arranged under the projection (not designated in any more detail) of the central tunnel 16. As can be seen, the display apparatus 12 has a multi-layer construction. The uppermost layer is a transparent cover layer 40, wherein a transparent touch-sensitive sensor layer 42 is arranged under the transparent cover layer 40, and a display layer 44, which includes organic light-emitting diodes, is arranged under the sensor layer. Under the display layer 44 there is also arranged a support layer 46 which exerts a force F, directed in the direction of the cover layer 40, on the display layer 44. The projection of the central tunnel 16 fixes the multi-layer construction, specifically in the vehicle vertical direction z, but clamps the layered construction only with such intensity that a translational relative movement between the individual layers 40, 42, 44 and/or 46 remains possible.

Here, the layers 40, 42, 44 and/or 46 may be equipped with an antistatic coating. In this way, during a translational relative movement between the layers 40, 42, 44 and/or 46, an electrostatic charge of the layers 40, 42, 44 and/or 46 is prevented. Furthermore, the cover layer 40 has an anti-reflection coating. Furthermore, it is however also possible for some of the layers 42, 44, 46 situated therebelow to likewise have an anti-reflection coating. This is conducive to improved readability and to an improved visual appearance of the display apparatus 12.

The transparent cover layer 40 is, in the end region 38 of the display apparatus 12, fastened to a component (not illustrated here) other than the display apparatus 12. In the arrangement, the remaining layers 42, 44, 46 of the display apparatus 12 are, in the end region 38, movable relative to one another in the vehicle longitudinal direction x and also relative to the cover layer 40. As can be seen in FIG. 4, all of the layers 40, 42, 44, 46, and additionally the linear guide 34, are connected to one another in the free end region 18 by way of the clamping apparatus 20. In other words, it is only at the free end region 18 that the layered construction of the display apparatus 12 is fixed such that the individual layers 40, 42, 44, 46 and the linear guide 34 cannot move in translational fashion relative to one another. By contrast, in the end region 38, only the transparent cover layer 40 is fixed such that the remaining layers 42, 44, 46 arranged therebelow can move in translational fashion relative to the cover layer 40.

In combination with the touch-sensitive sensor layer 42 and the display layer 44, which has the organic light-emitting diodes, the display apparatus 12 is thus in the form of a touchscreen. The sensor layer 42 may for example be in the form of a capacitive sensor layer such that touch actions on the transparent cover layer 42, for example by the index finger 24 as shown in FIG. 3, can be detected and converted into corresponding control commands for the operation of a wide variety of functional units of the motor vehicle.

Figure 6:
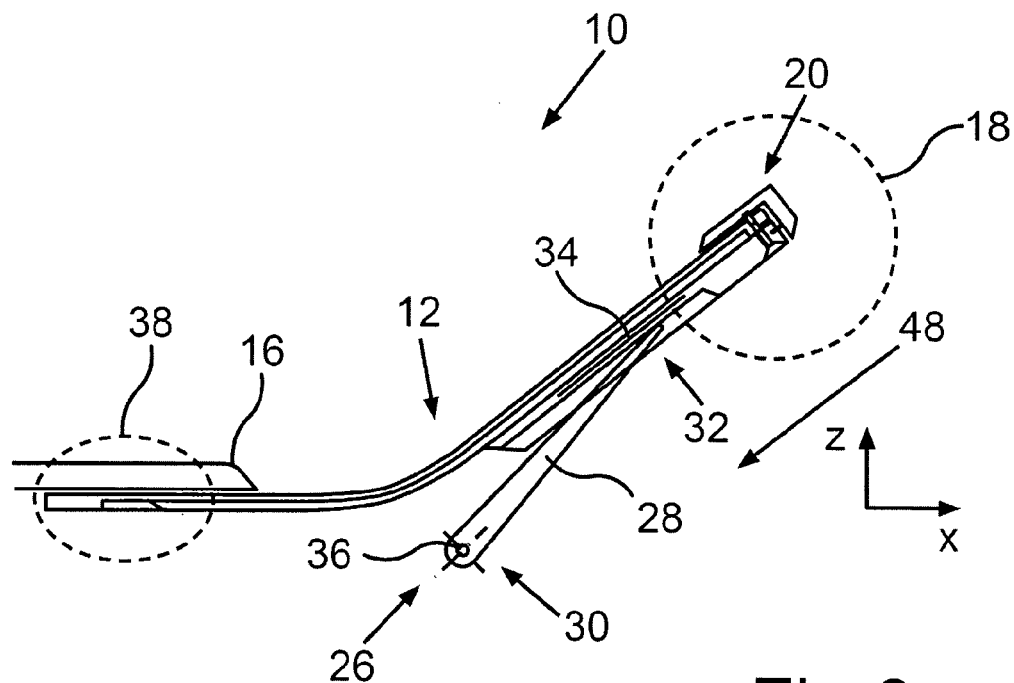
FIG. 6 is a further sectional side view, illustrating the display apparatus in its upwardly bent usage position and the then correspondingly erected lever.

Referring to FIG. 6, the display device 10 is shown again in a schematic sectional side view, wherein the display apparatus 12 is now illustrated in its upwardly bent usage position. The linear guide 34 already mentioned above simultaneously also serves as a support element for the display apparatus 12. For example, the linear guide may have a plate-like part which extends substantially over the entire height and width of that part of the display apparatus 12 which is free-standing in the upwardly bent usage position. When a pressure is exerted on the display apparatus 12 in the form of a touchscreen, the display apparatus is then supported in stable fashion by the linear guide, in particular in the vehicle longitudinal direction x in the present illustration.

The display device 10 may have a cover (not illustrated here) which, in the usage position of the display apparatus 12 shown in FIG. 6, conceals an opening 48 which arises as a result of pivoting of the display apparatus 12 from the stowing position into the usage position shown here. The cover will be discussed in more detail below with reference to FIGS. 10, 11a and 11b. Firstly, however, the behavior of the individual layers 40, 42, 44, 46 during the bending-up of the display apparatus 12 into the usage position will be discussed.

Figure 7:
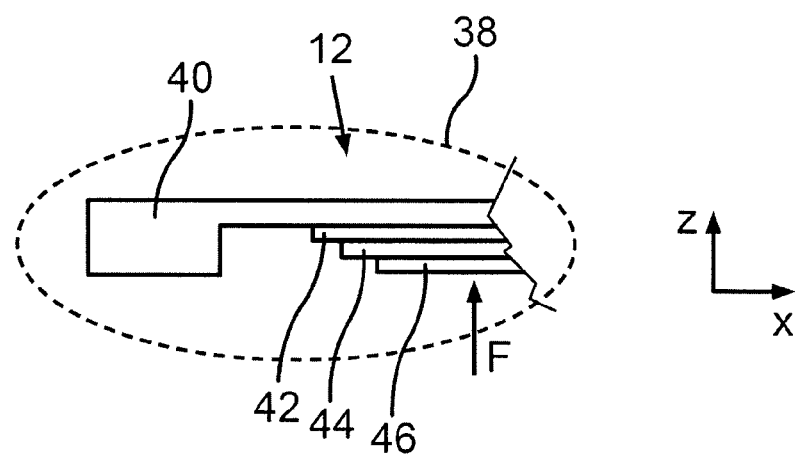
FIG. 7 is a sectional side view in which the various layers of the display apparatus are illustrated, wherein the arrangement thereof in the bent-up state of the display apparatus into the usage position is illustrated.

Referring to FIG. 7, in an enlarged schematic side view, the end region 38 is arranged below the projection of the central tunnel 16. As can be seen, the individual layers 40, 42, 44, 46 have been displaced relative to one another as a result of the bending-up of the display apparatus 12 into the usage position. In the present case, the layers 40, 42, 44, 46 are not connected to one another, for example adhesively bonded to one another, in the end region 38, such that a relative movement between all of the layers 40, 42, 44, 46 is made possible during the bending-up of the display apparatus 12 into the usage position. This yields the advantage that no undesired stresses, which could possibly damage the individual layers 40, 42, 44, 46, are generated. Alternatively, it may for example also be provided that the sensor layer 42 and the display layer 44 are for example adhesively bonded to one another, wherein the layered assembly formed from the two layers 42, 44 is in this case, as before, at least still relatively movable with respect to the transparent cover layer 40 and with respect to the support layer 46.

Figure 8:
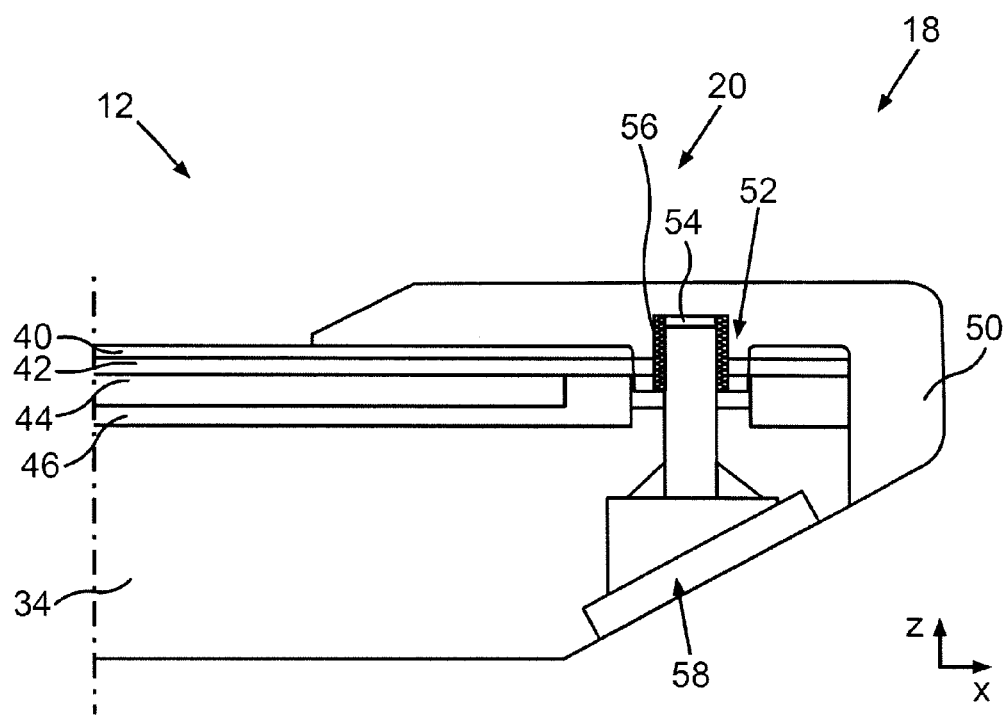
FIG. 8 is a illustration of a free end region of the multi-layer display apparatus, wherein a clamping apparatus, by way of which the individual layers of the display apparatus are connected to one another, is shown in detail.

Referring to FIG. 8, the free end region 18 indicated in FIGS. 4 and 6 is shown in an enlarged sectional side view. The clamping apparatus 20 includes a clamping element 50, a multiplicity (plurality) of bores 52 and a multiplicity (plurality) of screws 54. The individual layers 40, 42, 44, 46 and the linear guide 34 are extended through in the transverse direction y by a multiplicity of the bores 52, wherein respective screws 54 are inserted into the respective bores 52. The clamping element 50 has, in the respective bores 52, respective internal threads 56 into which the screws 54 are screwed. Thus, by way of the clamping apparatus 20, the individual layers 40, 42, 44, 46 and the linear guide 34 are fixedly connected to one another, such that, in the free end region 18 of the display apparatus 12, no relative movement between the individual components of the display apparatus 12 is permitted. The clamping apparatus 20 may furthermore also have a cover 58 by way of which the respective screws 54 are concealed.

Figure 9A:
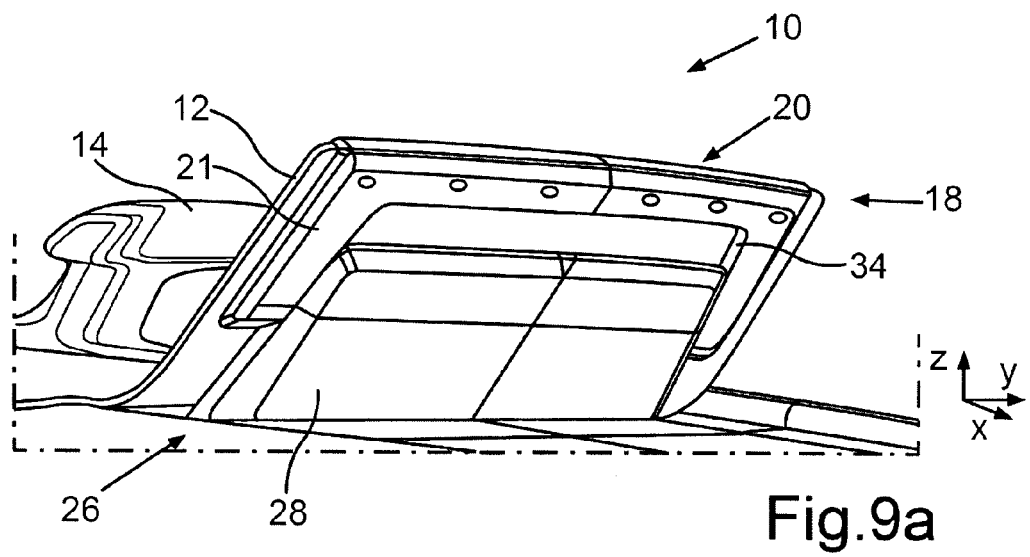
FIG. 9a is a perspective rear view of the display apparatus that has been bent upward into its usage position.

Referring to FIG. 9a, the display device 10 in a perspective rear view is shown, wherein the display apparatus 12 is shown in its upwardly bent usage position. As can be seen, the lever 28 of the lever mechanism 26 extends over almost the entire width of the display apparatus 12, wherein the linear guide 34 is in the form of a frame which is open on one side and in which the lever 28 is guided. Owing to the width of the lever 28, the display apparatus 12 is firstly supported particularly securely in the usage position and is secondly, during the upward bending of the display apparatus 12, acted on with an erecting force substantially uniformly over a relatively large surface area. In the embodiment shown here, the display apparatus 12 projects laterally—that is to say in the vehicle transverse direction y—out of the clamping apparatus 20. In other words, the laminar layered construction of the display apparatus 12 is not laterally delimited by the clamping apparatus 20.

Figure 9B:
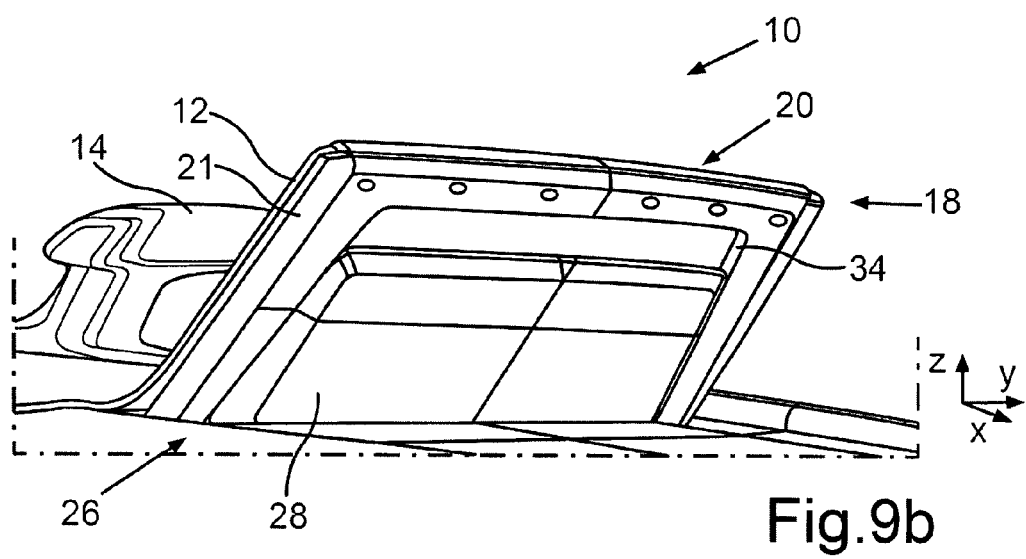
FIG. 9b is a perspective rear view of an alternative embodiment of the display device, wherein the display apparatus has again been bent upward into its usage position.

Referring to FIG. 9b, an alternative embodiment of the display device 10 is shown. To make it possible to realize a particularly robust construction of the display apparatus 12, it is provided in the embodiment illustrated here that the clamping apparatus 20 laterally surrounds the display apparatus 12, that is to say surrounds the display apparatus in the manner of a frame. Corresponding lateral limbs 21 of the clamping apparatus 20 surround the lateral edge regions of the display apparatus 12 at least over a certain region.

Figure 10:
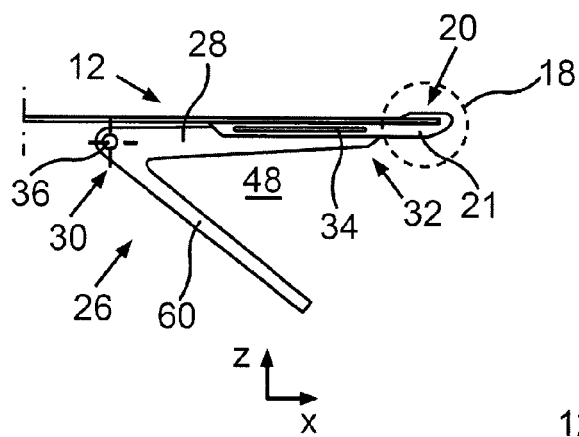
FIG. 10 is a further sectional side view of the display apparatus arranged in its stowing position, wherein, in the present case, the lever for the bending-up of the display apparatus is of V-shaped form.

Referring to FIG. 10, the display apparatus 12 is shown in a detail in its downwardly folded stowing position. In the exemplary embodiment shown here, the lever mechanism 26 is of substantially V-shaped form, wherein the lever mechanism 26 has not only the lever 28, which serves for the adjustment of the display apparatus 12, but also has a further limb or lever which serves as a cover 60. If the lever 28 is now pivoted counterclockwise in order to bend the display apparatus 12 from the stowing position shown in FIG. 10 into the upwardly bent usage position, the limb or lever which serves as the cover 60 is likewise jointly pivoted counterclockwise.

Figure 11A:
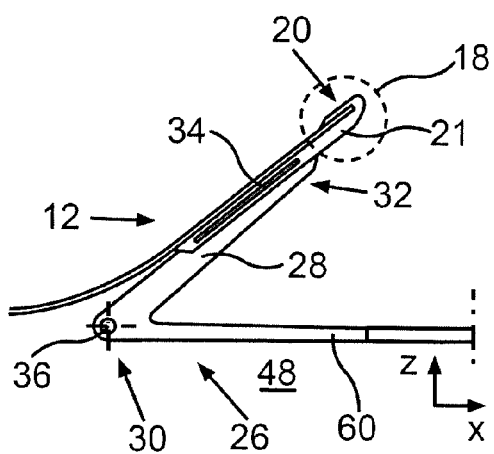
FIG. 11a is a further sectional side view of the arrangement shown in FIG. 10, wherein the display apparatus is shown in its upwardly bent usage position.

Referring to FIG. 11a, the display apparatus 12 is shown bent into the usage position, again in a schematic side view. By virtue of the fact that the lever mechanism 26 is of a V-shaped form, that is to say has not only the lever 28 but also the cover 60, the opening 48 below the upwardly bent display apparatus 12 is closed off by way of the cover 60, wherein the cover 60 terminates flush with the central tunnel 16. It can firstly be ensured in this way that no objects, in particular no dirt, pass(es) into the opening 48 when the display apparatus 12 has been bent upward into its usage position. Secondly, this also improves the visual appearance of the display device 10 as a whole, and it is not possible to see into the opening 48.

Figure 11B:
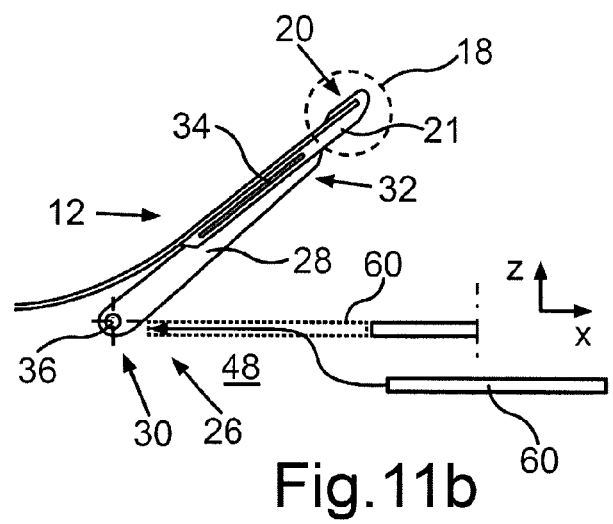
FIG. 11b is a further sectional side view of the display apparatus arranged in its usage position, wherein, in the present case, a cover in the form of a lid is provided, by way of which an opening which is exposed as a result of the pivoting of the display apparatus is concealed.

Referring to FIG. 11b, the display apparatus 12 is shown bent into the usage position, again in a schematic side view. In the exemplary embodiment shown here, the cover 60 is realized by way of lid-like cover. During the pivoting of the display apparatus 12 from the recessed stowing position into the usage position shown here, the cover is displaced in the vehicle longitudinal direction x such that the opening 48 that opens up is thereby concealed. The cover in the form of a lid can, while the display apparatus 12 is arranged in its lowered stowing position, be arranged in recessed fashion, so as not to be visible to the vehicle occupants, below a subregion of the central tunnel 16. The advantage of the embodiment of the cover 60 shown in FIG. 11b in relation to the embodiment of the cover 60 shown in FIGS. 10 and 11a includes that the opening 48 can be closed off or covered particularly quickly. The cover 60 shown in FIG. 11b can be moved synchronously with the movement of the lever 28 such that the opening 48 is closed off as quickly as possible.

Figure 12:
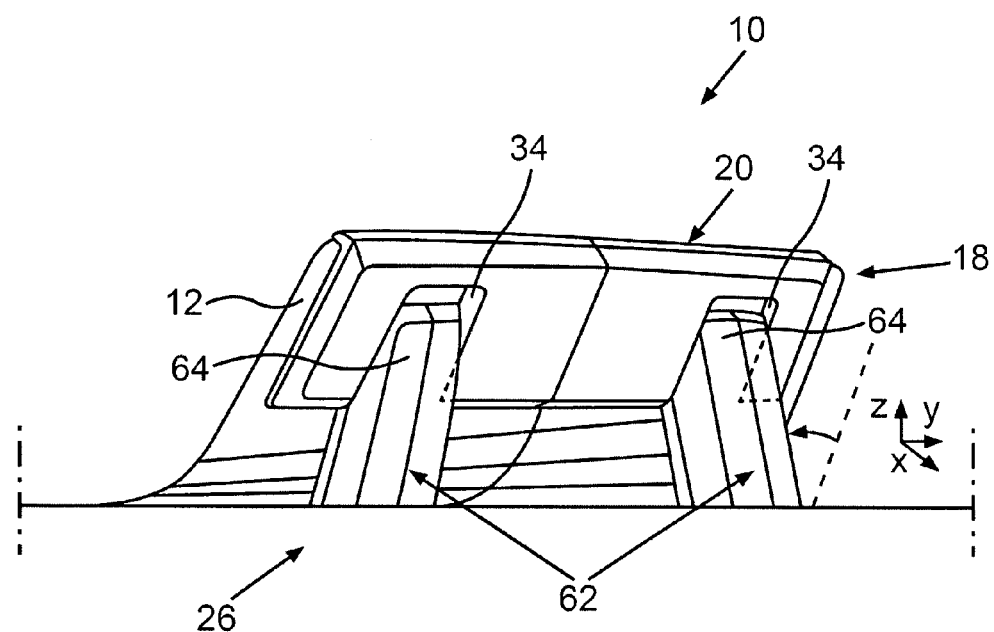
FIG. 12 is a perspective rear view of the display apparatus that has been bent up into its usage position, wherein two levers are arranged on the display apparatus, by way of which levers the display apparatus can be bent back and forth between the stowing position and the usage position.

Referring to FIG. 12 an alternative embodiment of the display device 10 is shown in a perspective rear view, wherein the display apparatus 12 is shown in its upwardly bent usage position. In the embodiment of the display device 10 of FIG. 12, the lever mechanism 26 has two levers 62 which, by way of respective end regions (not visible here), are pivotably mounted on at least one component of the display device 10 other than the display apparatus 12 and, by way of respective opposite end regions 64, are mounted on respective linear guides 34 fastened to the display apparatus 12.

By virtue of the fact that two levers 62 are provided, it is possible not only to influence the inclination of the display apparatus 12 in the vehicle vertical direction z. By way of different actuation or pivoting of the levers 62, it is furthermore possible for the display apparatus 12 to additionally be inclined in the direction of a driver or of a front-seat passenger in the usage position. For example, by way of the sensor layer 44, it may be detected whether a driver or a front-seat passenger is moving his or her hand or finger toward the display apparatus 12. For example, if it is detected that the driver is moving his or her finger toward the display apparatus 12, the two levers 62 are actuated and pivoted such that the display apparatus 12 is inclined in the direction of the driver. Conversely, it is likewise possible that, as soon as it is detected that a front-seat passenger is moving his or her finger, for example, toward the display apparatus 12, the levers 62 are in turn actuated and pivoted such that the display apparatus 12 is inclined in the direction of the front-seat passenger. In order to detect whether it is a driver or a front-seat passenger that presently wishes to interact with or operate the display apparatus 12, it may additionally also be provided, for example, that a camera system is integrated in the motor vehicle, which camera system is designed to detect whether it is presently a driver or a front-seat passenger that is moving one of his or her fingers toward the display unit 12. If neither the driver nor the front-seat passenger presently wishes to operate the display apparatus 12, it may be provided that the levers 62 are in turn actuated such that the display apparatus 12 is pivoted merely upward into its usage position, wherein the display apparatus 12, in the usage position, assumes a type of neutral position in which the display apparatus 12 is inclined neither toward the driver nor toward the front-seat passenger.

Only the situation in which the display device 10 is arranged in the region of a central tunnel 16 in the front seat row of a motor vehicle has hitherto been discussed in the exemplary embodiments discussed here. It is substantially possible for the display device 10 to be arranged in any desired positions in the vehicle interior, for example on a central console, on an instrument panel or else for example in the rear-seat region of a motor vehicle, for example as a display apparatus for a rear-seat entertainment system.

By virtue of the fact that the display apparatus 12 can be bent into the usage position as required, particularly good ergonomic operation of the display apparatus 12 is made possible. In particular in the case of a display apparatus 12 in the form of a touchscreen, particularly stable support of the display apparatus 12 in the usage position is made possible by way of the discussed display device 10.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A display device for a motor vehicle, comprising:
   a flexible display apparatus; and
   a pivotable lever mechanism configured to bend the flexible display apparatus so as to move the flexible display apparatus from a stowed position into a usage position.

2. The display device as claimed in claim 1, wherein
   the flexible display apparatus includes a linear guide,
   the pivotable lever mechanism includes at least one lever,
   the display device further comprises a component to which one end region of the at least one lever is pivotably mounted, and
   an opposite end region of the at least one lever is mounted on the linear guide.

3. The display device as claimed in claim 1, wherein
   the flexible display apparatus includes at least two linear guides,
   the pivotable lever mechanism includes at least two levers,
   the display device further comprises at least one component to which respective end regions of the at least two levers are pivotably mounted, and
   respective opposite end regions of the at least two levers are mounted on the at least two linear guides, respectively.

4. The display device as claimed in claim 1, wherein
   the flexible display apparatus includes a plurality of layers including an upper layer fastened, in a first end region of the flexible display apparatus, to a component of the display device other than the flexible display apparatus, and
   the plurality of layers are connected to one another by a clamping apparatus provided at a free end region, arranged opposite the first end region, of the flexible display apparatus.

5. The display device as claimed in claim 4, wherein
   the plurality of layers further include a display layer arranged below the upper layer and having organic light-emitting diodes, and
   the upper layer is a transparent cover layer.

6. The display device as claimed in claim 5, wherein the plurality of layers further include a support layer, arranged below the display layer, configured to exert on the display layer a force directed in a direction of the transparent cover layer, the support layer being at least relatively movable in relation to the transparent cover layer with respect to the first end region.

7. The display device as claimed in claim 4, wherein
   the plurality of layers further include a transparent touch-sensitive sensor layer and a display layer having organic light-emitting diodes, and
   the upper layer is a transparent cover layer below which there are arranged the transparent touch-sensitive sensor layer and the display layer.

8. The display device as claimed in claim 7, wherein the plurality of layers further include a support layer, arranged below the display layer, configured to exert on the display layer a force directed in a direction of the transparent cover layer, the support layer being at least relatively movable in relation to the transparent cover layer with respect to the first end region.

9. The display device as claimed in claim 1, further comprising a cover configured to conceal an opening which arises in the usage position of the flexible display apparatus as a result of moving the flexible display apparatus from the stowed position into the usage position.

10. A motor vehicle, comprising:
    a chassis; and
    a display device including:
       a flexible display apparatus; and
       a pivotable lever mechanism configured to bend the flexible display apparatus so as to move the flexible display apparatus from a stowed position into a usage position.

11. The motor vehicle as claimed in claim 10, further comprising:
    a central tunnel; and
    a gear selector lever,
    wherein the flexible display apparatus is arranged on the central tunnel and in front of the gear selector lever in a longitudinal direction of the motor vehicle.

12. The motor vehicle as claimed in claim 11, wherein in the usage position the flexible display apparatus is curved upward in an arc-shape in a vertical direction of the motor vehicle and in the longitudinal direction of the motor vehicle, such that a substantially constant spacing is provided between the gear selector lever and the flexible display apparatus.

13. A method for operating a display device of a motor vehicle, the method comprising:
    bending a flexible display apparatus of the display device by operation of a pivotable lever mechanism, so as to move the flexible display apparatus from a stowed position into a usage position.

14. The method as claimed in claim 13, wherein the flexible display apparatus is bent while moving the flexible display apparatus from the stowed position to the usage position in response to an ignition of the motor vehicle being activated.

15. The method as claimed in claim 13, wherein the flexible display apparatus is bent while moving the flexible display apparatus from the usage position to the stowed position in response to an ignition of the motor vehicle being deactivated.

16. The method as claimed in claim 13, further comprising predefining the usage position in a manner dependent on a detected personal identifier.

17. The method as claimed in claim 13, wherein bending the flexible display apparatus comprises:
    fixing, by a clamp, a first end of a plurality of layers of the flexible display apparatus to a first end region of the flexible display apparatus so as to prevent displacement of the first end of the plurality of layers with respect to one another in a longitudinal direction of the motor vehicle;
    fixing, by a projection of a central tunnel of the motor vehicle, a second end of the plurality of layers to a second end region of the flexible display apparatus so as to allow displacement of the second end of at least some of the plurality of layers with respect to one another in the longitudinal direction; and
    pivoting a lever of the pivotable lever mechanism from a first position to a second position about an axis of rotation which is perpendicular to the longitudinal direction, thereby causing displacement of the second end of the at least some of the plurality of layers with respect to one another in the longitudinal direction.

18. The method as claimed in claim 13, wherein bending the flexible display apparatus comprises:
   determining whether a driver or a passenger desires to interact with the flexible display apparatus; and
   pivoting a plurality of levers of the pivotable lever mechanism from respective first positions to respective second positions about an axis of rotation which is perpendicular to a longitudinal direction of the motor vehicle, thereby causing displacement of a plurality of layers of the flexible display apparatus with respect to one another in the longitudinal direction and causing the flexible display apparatus to be inclined in a direction toward the determined driver or passenger.

* * * * *